US006800884B1

United States Patent
Feng et al.

(10) Patent No.: US 6,800,884 B1
(45) Date of Patent: Oct. 5, 2004

(54) INTER-TILE BUFFER SYSTEM FOR A FIELD PROGRAMMABLE GATE ARRAY

(75) Inventors: Sheng Feng, Cupertino, CA (US); Tong Liu, San Jose, CA (US); Jung-Cheun Lien, San Jose, CA (US)

(73) Assignee: Actel Corporation, Mountain View, CA (US)

( * ) Notice: Subject to any disclaimer, the term of this patent is extended or adjusted under 35 U.S.C. 154(b) by 0 days.

(21) Appl. No.: 10/334,393

(22) Filed: Dec. 30, 2002

(51) Int. Cl.[7] .............................................. H01L 27/10
(52) U.S. Cl. ...................... 257/209; 257/208; 257/202; 326/41
(58) Field of Search ................................ 257/202, 208, 257/209; 326/41

(56) References Cited

U.S. PATENT DOCUMENTS

| | | | |
|---|---|---|---|
| 5,451,887 A | 9/1995 | El-Avat et al. | 326/39 |
| 5,477,165 A | 12/1995 | ElAyat et al. | 326/38 |
| 5,570,041 A | 10/1996 | El-Avat et al. | 326/41 |
| 5,606,267 A | 2/1997 | El Ayat et al. | 326/41 |
| 5,625,301 A | 4/1997 | Plants et al. | 326/41 |
| 5,698,992 A | 12/1997 | El Ayat et al. | 326/41 |
| 6,211,697 B1 | 4/2001 | Lien et al. | 326/41 |
| 6,380,759 B1 * | 4/2002 | Agrawal et al. | 326/41 |
| 6,448,808 B2 * | 9/2002 | Young et al. | 326/41 |
| 6,476,636 B1 | 11/2002 | Lien et al. | 326/41 |
| 6,504,398 B1 | 1/2003 | Lien et al. | 326/41 |
| 6,700,404 B1 * | 3/2004 | Feng et al. | 326/41 |
| 6,731,133 B1 * | 5/2004 | Feng et al. | 326/41 |

* cited by examiner

Primary Examiner—Nathan J. Flynn
Assistant Examiner—Pershelle Greene
(74) Attorney, Agent, or Firm—Sierra Patent Group, Ltd.

(57) ABSTRACT

The invention relates to an inter-tile buffering system for a field programmable gate array. The field programmable gate array is comprised of the following. A plurality of field programmable gate array tiles are arranged in an array of rows and columns. Each of said field programmable gate array tiles comprises a plurality of functional groups and a plurality of interface groups, and a primary routing structure. The primary routing structure is coupled to said functional groups and interface groups and is configured to receive primary output signals, route primary output signals within said at least one field programmable gate array tile, and provide primary input signals to said functional groups and interface groups. Each functional group is configured to receive primary input signals, perform a logic operation, and generate primary output signals. Each interface group is configured to transfer signals from said primary routing structure to outside of said at least one field programmable gate array tile, and includes a plurality of input multiplexers configured to select signals received from outside of said at least one field programmable gate array tile and provide signals to the primary routing structure inside said at least one field programmable gate array tile. Said primary routing structure comprises a horizontal bus and a vertical bus. A horizontal buffer is located between each column of field programmable gate array tiles and is coupled to the primary routing structure. A vertical buffer is located between each row of field programmable gate array tiles and is coupled to the primary routing structure.

17 Claims, 12 Drawing Sheets

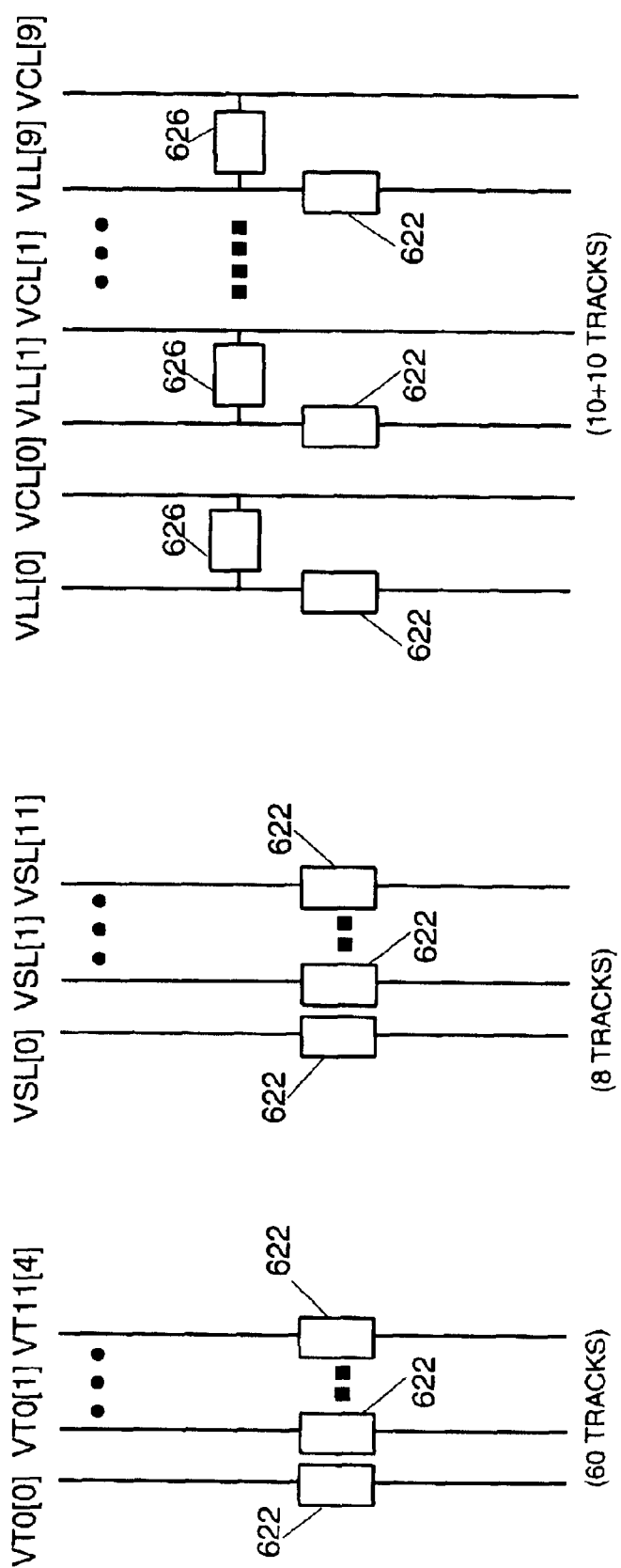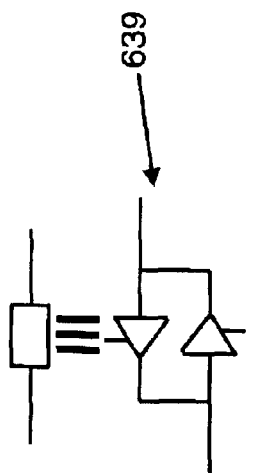
FIG. 10A
FIG. 10B

INTER-TILE BUFFER SYSTEM FOR A FIELD PROGRAMMABLE GATE ARRAY

BACKGROUND OF THE INVENTION

1. Field of the Invention

The present disclosed system relates to field-programmable gate arrays, and more particularly, to freeway architectures in field-programmable gate arrays.

2. Description of the Related Art

A field programmable gate array is an integrated circuit (IC) that includes a two-dimensional array of general-purpose logic circuits, called cells or logic blocks, whose functions are programmable. The cells are linked to one another by programmable buses. The cell types may be small multifunction circuits (or configurable functional blocks or groups) capable of realizing all Boolean functions of a few variables. The cell types are not restricted to gates. For example, configurable functional groups typically include memory cells and connection transistors that may be used to configure logic functions such as addition, subtraction, etc., inside of the field programmable gate array. A cell may also contain at least one flip-flop. Some types of logic cells found in field programmable gate arrays are those based on multiplexers and those based on programmable read only memory (PROM) table-lookup memories. Erasable field programmable gate arrays can be reprogrammed many times. This technology is especially convenient when developing and debugging a prototype design for a new product and for small-scale manufacture.

Field programmable gate arrays typically include a physical template that includes an array of circuits, sets of uncommitted routing interconnects, and sets of user programmable switches associated with both the circuits and the routing interconnects. When these switches are properly programmed (set to on or off states), the template or the underlying circuits and interconnects of the field programmable gate array are customized or configured to perform specific customized functions. By reprogramming the on-off states of these switches, a field programmable gate array can perform many different functions. Once a specific configuration of a field programmable gate array has been decided upon, it can be configured to perform that one specific function.

The user programmable switches in a field programmable gate array can be implemented in various technologies, such a ONO antifuse, M-M antifuse, SRAM memory cell, Flash EPROM memory cell, and EEPROM memory cell. Field programmable gate arrays that employ fuses or antifuses as switches can be programmed only once. A memory cell controlled switch implementation of a field programmable gate array can be reprogrammed repeatedly. In this scenario, an NMOS transistor is typically used as the switch to either connect or disconnect two selected points (A, B) in the circuit. The NMOS' source and drain nodes are connected to points A, B respectively, and its gate node is directly or indirectly connected to the memory cell. By setting the state of the memory cell to either logical "1" or "0", the switch can be turned on or off and thus point A and B are either connected or disconnected. Thus, the ability to program these switches provides for a very flexible device.

Field programmable gate arrays can store the program that determines the circuit to be implemented in a RAM or PROM on the field programmable gate array chip. The pattern of the data in this configuration memory ("CM") determines the cells' functions and their interconnection wiring. Each bit of CM controls a transistor switch in the target circuit that can select some cell function or make (or break) some connection. By replacing the contents of CM, designers can make design changes or correct design errors. The CM can be downloaded from an external source or stored on-chip. This type of field programmable gate array can be reprogrammed repeatedly, which significantly reduces development and manufacturing costs.

In general, a field programmable gate array is one type of Programmable Logic Device (PLD), i.e., a device that contains many gates or other general-purpose cells whose interconnections can he configured or "programmed" to implement any desired combinational or sequential function. As its name implies, a field programmable gate array is "field-programmable", meaning that the device is generally programmed by designers or end users "in the field" via small, low-cost programming units. This is in contrast to mask programmable devices which require special steps in the IC chip-manufacturing process.

A field-programming unit typically uses design software to program the field programmable gate array. The design software compiles a specific user design, i.e., a specific configuration of the programmable switches desired by the end-user, into field programmable gate array configuration data. The design software assembles the configuration data into a bit stream, e.g., a stream of ones and zeros, that is fed into the field programmable gate array and used to program the configuration memories for the programmable switches or program the shift registers for anti-fuse type switches. The bit stream creates the pattern of the data in the configuration memory CM that determines whether each memory cell stores a "1" or a "0". Each stored bit the CM controls whether its associated transistor switch is turned on or off. End users typically use design software to test different designs and run simulations for field programmable gate arrays.

When a field programmable gate array that has been programmed to perform one specific function is compared to an Application Specific Integrated Circuit (ASIC) that has been designed and manufactured to perform that same specific function, the field programmable gate array will necessarily be a larger device than the ASIC. This is because field programmable gate arrays are very flexible devices that are capable of implementing many different functions, and as such, they include a large amount of excess circuitry that is either not used or could be replaced with hard-wired connections when performing one specific function. Such excess circuitry generally includes the numerous programmable transistor switches and corresponding memory cells that are not used in implementing the one specific function, the memory cells inside of functional groups, and the field programmable gate array programming circuitry. This excess circuitry is typically eliminated in the design of an ASIC which makes the ASIC a smaller device. An ASIC, on the other hand, is not a flexible device. Once an ASIC has been designed and manufactured it cannot be reconfigured to perform a different function like is possible with a field programmable gate array.

Designers of field programmable gate arrays (as well as other PLDs) often provide their circuit designs to IC manufacturers who typically manufacture the field programmable gate arrays in two different ways. First, a field programmable gate array design may be manufactured as its own chip with no other devices being included in the IC package. Second, a field programmable gate array design may be embedded into a larger IC. An example of such a larger IC is a system on a chip (SOC) that includes the embedded field programmable gate array as well as several other components. The several other components may include, for example, a microprocessor, memory, arithmetic logic unit (ALU), state machine, etc. In this scenario the embedded field programmable gate array may be only a small part of the whole SOC.

BRIEF SUMMARY OF THE INVENTION

The invention relates to an inter-tile buffering system for a field programmable gate array. The field programmable gate array is comprised of the following. A plurality of field programmable gate array tiles are arranged in an array of rows and columns. Each of said field programmable gate array tiles comprises a plurality of functional groups and a plurality of interface groups, and a primary routing structure. The primary routing structure is coupled to said functional groups and interface groups and is configured to receive primary output signals, route primary output signals within said at least one field programmable gate array tile, and provide primary input signals to said functional groups and interface groups. Each functional group is configured to receive primary input signals, perform a logic operation, and generate primary output signals. Each interface group is configured to transfer signals from said primary routing structure to outside of said at least one field programmable gate array tile, and includes a plurality of input multiplexers configured to select signals received from outside of said at least one field programmable gate array tile and provide signals to the primary routing structure inside said at least one field programmable gate array tile. Said primary routing structure comprises a horizontal bus and a vertical bus. A horizontal buffer is located between each column of field programmable gate array tiles and is coupled to the primary routing structure. A vertical buffer is located between each row of field programmable gate array tiles and is coupled to the primary routing structure.

A better understanding of the features and advantages of the invention will be obtained by reference to the following detailed description of the disclosed system and accompanying drawings that set forth an illustrative embodiment in which the principles of the disclosed system are utilized.

BRIEF DESCRIPTION OF THE DRAWINGS

FIGS. 10a and 10b are schematics illustrating intra-tile vertical buffers.

DETAILED DESCRIPTION OF THE INVENTION

Figure 1:
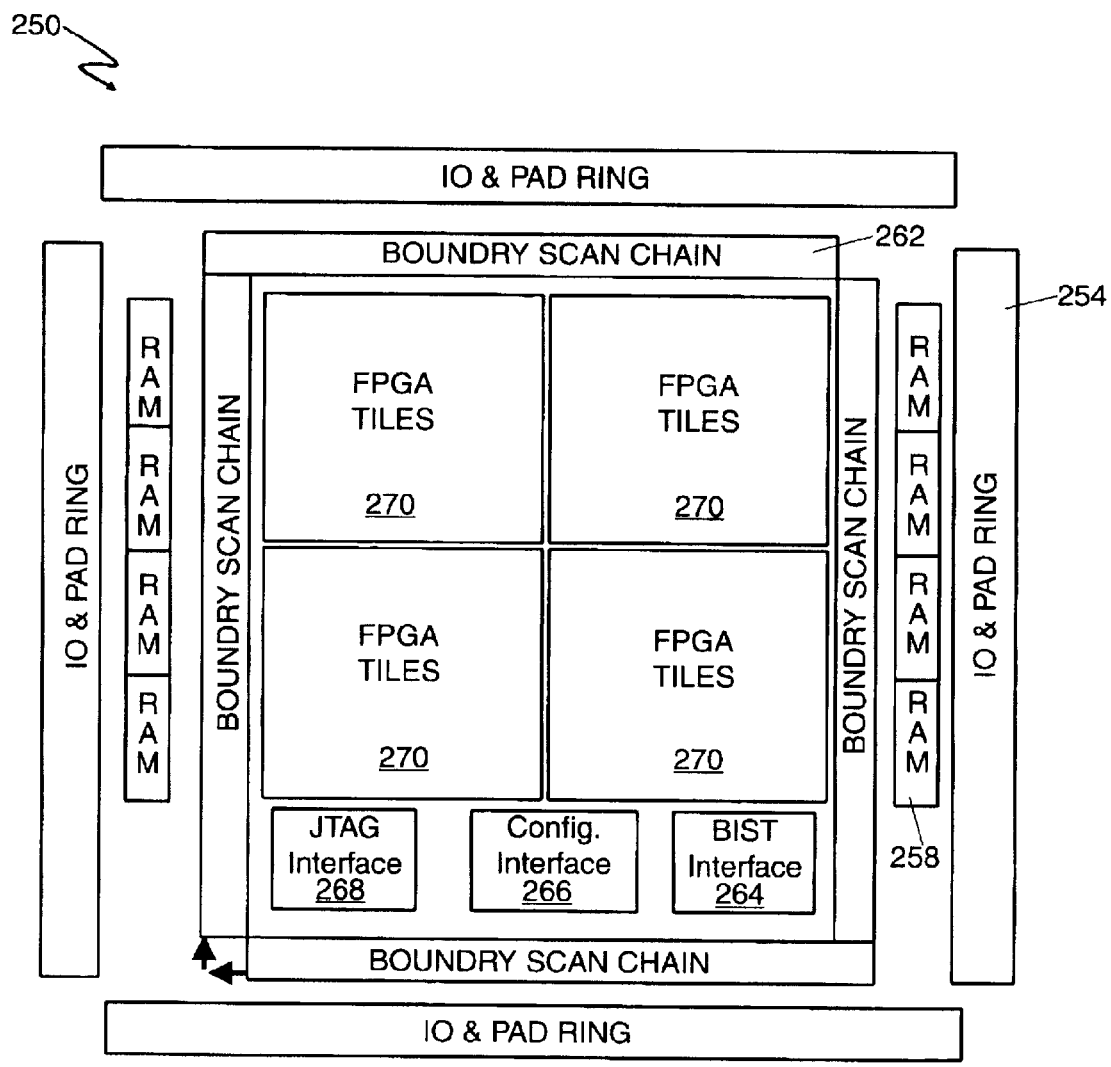
FIG. 1 is a schematic illustrating a field programmable gate array.

In FIG. 1, an overall view of one embodiment of the disclosed system is shown. Field-programmable gate array (FPGA) 250 has IO & PAD ring 254 on the outer perimeter. RAM blocks 258 are between IO & PAD ring 254 and boundary scan chains 262. Circuitry within and including boundary scan chains 262 forms a core to which RAM may be added. This core is also easily adapted to other configurations.

In this embodiment four FPGA tiles 270 are shown arranged in a 2 by 2 matrix. Built in self-test interface module ("BIST") 264 is adjacent to FPGA tiles 270. Configuration interface 266 is a configuration control module that receives the bitstream program into its configuration RAM. Joint test action group ("JTAG") interface 268 is a module that is an access point that allows for high-level test control.

Figure 2:
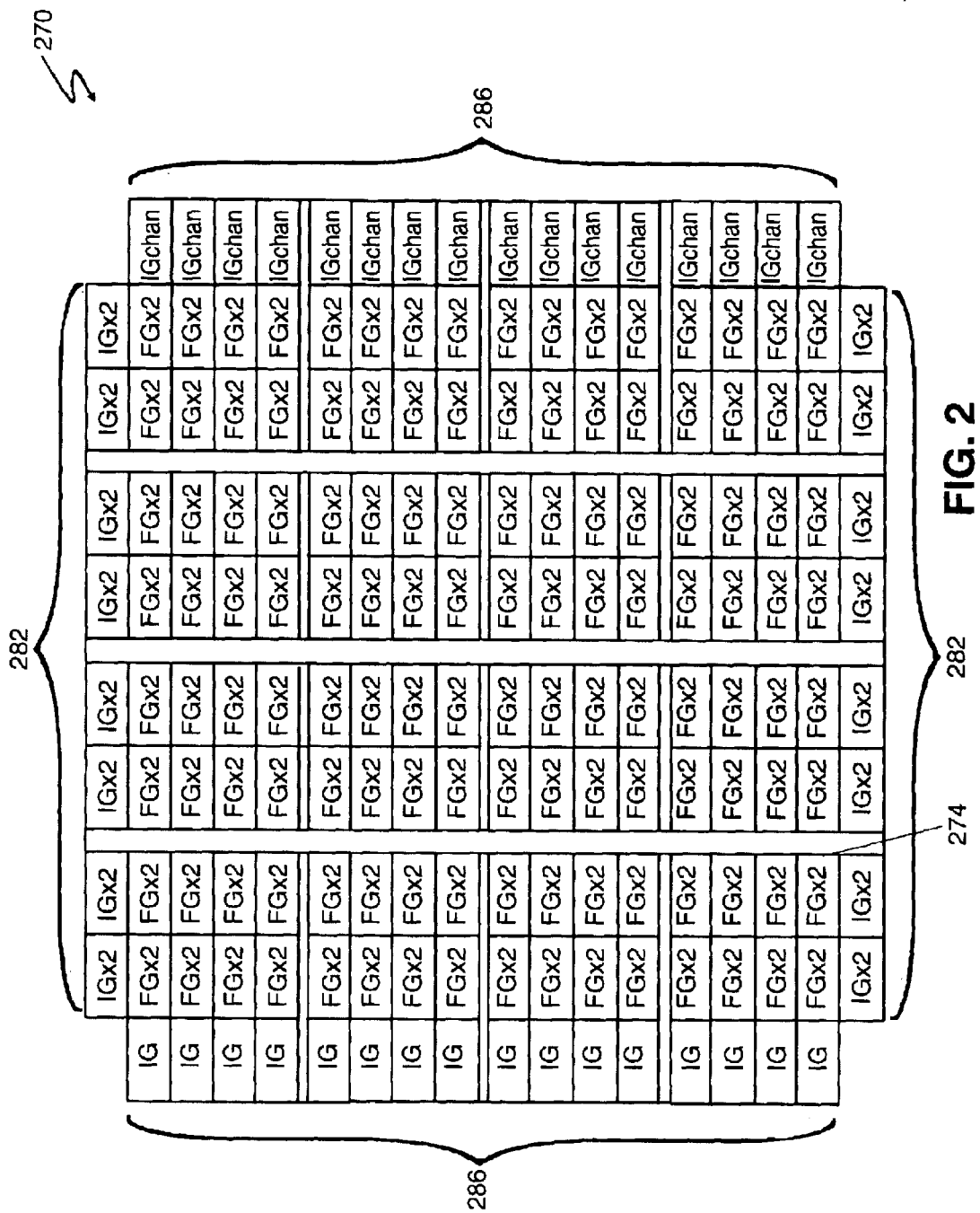
FIG. 2 is a schematic illustrating a more detailed view of one tile shown in FIG. 1.

FIG. 2 is a schematic illustrating a more detailed view of FPGA tile 270 from FIG. 1. In one embodiment, each FPGA tile is made up of a plurality of pairs of functional groups (FGs—each pair referred to as a "FG×2") 274 arranged in a side-by-side manner. FGs are small multifunction circuits that are capable of realizing many Boolean functions. The FGs include look-up tables (LUTs) and other circuits capable of realizing Boolean functions, as well as memory cells that are used to configure logic functions such as addition, subtraction, etc.

Still referring to FIG. 2, in one embodiment FG×2s 274 are arranged in a 16 by 8 array of FG×2s. Since an FG×2 is a pair of side by side FGs, then this array is equivalent to a 16 by 16 array of FGs. Each row containing 8 FG×2s comprise 16 FGs because there are 2 side by side FGs in each FG×2. Please refer to FIG. 3 for a more detailed view of FG×2 274.

Around the outer perimeter of the 16×8 FG×2 array are interface groups ("IGs") 286. IGs 286 provide an interface for FPGA tiles 270 to other FPGA tiles or devices, or to pad rings for connecting the FPGA tiles to IC package pins. In general, the logic structure of the FPGA tile is provided by the FGs and the IGs. The IGs are arranged around the FG×2 array as follows: There are two columns of IGs 286, one on the left side and one on the right side of the FG×2 array. There are two rows 282 of pairs of IGs referred to as IG×2 located on the top side and bottom side of the FG×2 array.

Also included in the FPGA tiles, but not shown in FIG. 2, are several horizontal and vertical regular routing buses, routing interconnect areas, switching transistors, and global signal distribution routing structure, all of which will be discussed below.

Figure 3:
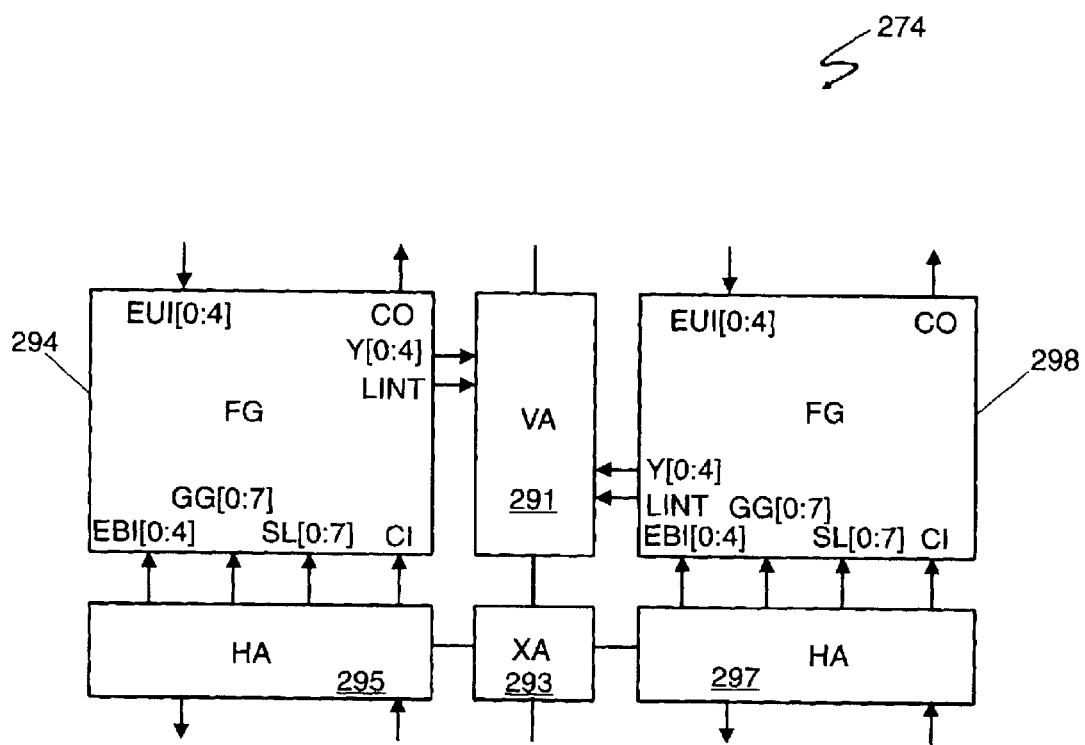
FIG. 3 is a schematic illustrating a more detailed view of a side-by-side pair of functional groups.

FIG. 3 illustrates a more detailed view of FG×2 274. Two FGs 294 and 298 comprise FG×2 274. Each of FGs 294 and 298 are configured to receive inputs from the following routing resources: EUI[0:4], EBI[0:4], GG[0:7], SL[0:7] and CI. Both of FGs 294 and 298 are also configured to send outputs through the following resources: CO, Y[0:4], and LINT ports. The LINT ports carry a secondary routing signal. Between FGs 294 and 298 is a vertical channel containing vertical bus VA 291 which carries the following routing resources: VT[0:11][0:4], VSL[0:7], VLL[0:9], and VCL[0:9]. The convention of [0:11][0:4] means that there are 12 (0 through 11) sets of 5 (0 through 4) routing resources. Adjacent to VA bus 291 is cross bus XA 293. The routing within XA 293 is described in detail in FIG. 10. Horizontal busses HA 295 and 297 carry the following routing resources: HT[0:11][0:4], HSL[0:7], HLL[0:9], HCL[0:9], and HFT[0:4].

Figure 4:
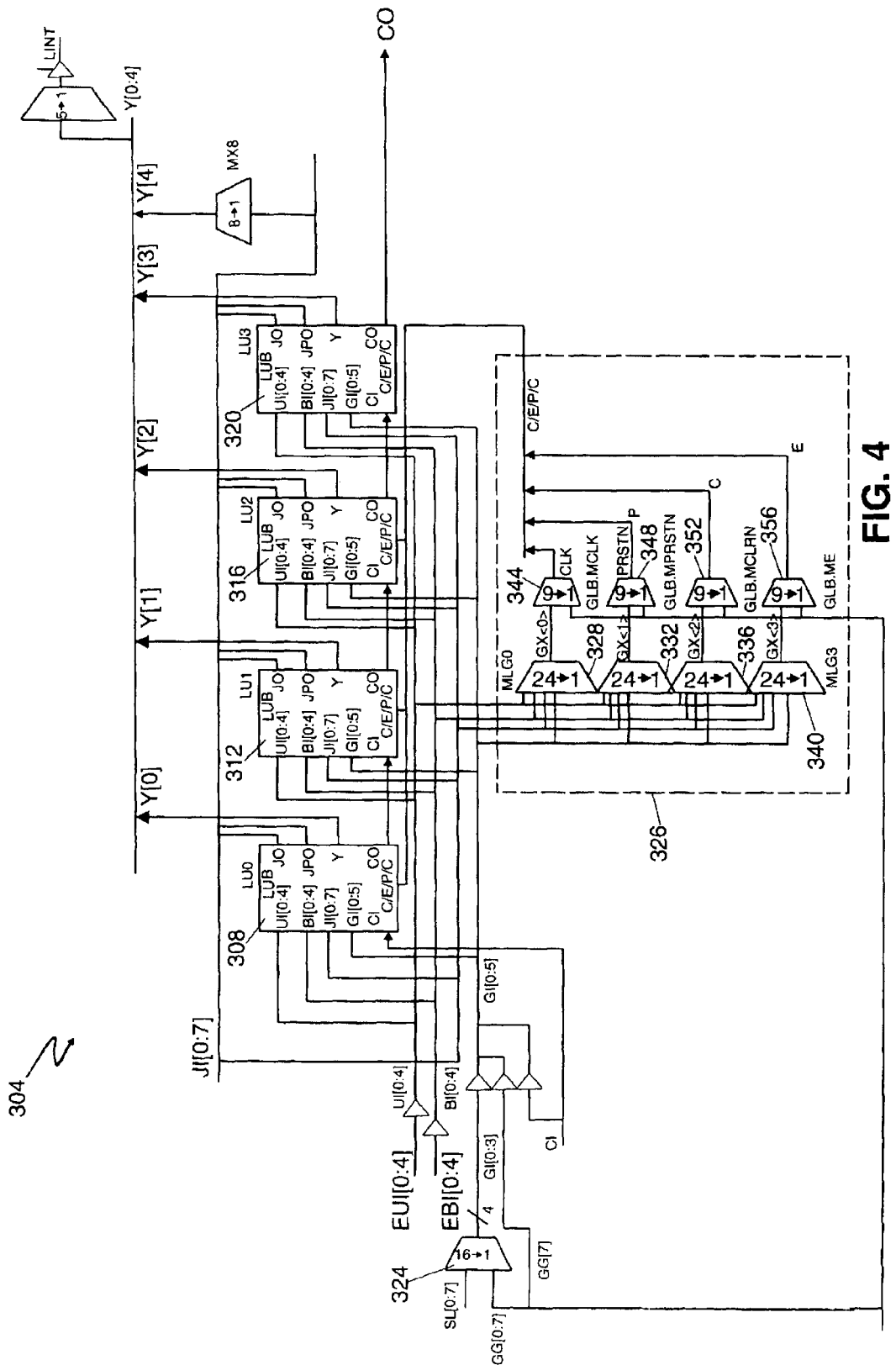
FIG. 4 is a schematic illustrating a more detailed view the inner components and connections of a functional group.

FIG. 4 illustrates a schematic providing a more detailed view of FGs from FIG. 3. Each FG 304 may include four logic units ("LUBs") 308, 312, 316, 320. Each LUB is coupled to routing resource Y[0] through Y[3] respectively. LUBs 308, 312, 316 and 320 provide Boolean functions and logic operations of FG 304. Each of the LUBs 308, 312, 316 and 320 includes several inputs on which Boolean functions and logic operations are performed. As shown, each of LUBs 308, 312, 316 and 320 includes, twenty-four such inputs (not including the CI routing resource), but it should be understood that the number of inputs may vary in accordance with the invention. Specifically, each of LUBs 308, 312, 316 and 320 receives signals through input ports UI[0:4] and BI[0:4] which correspond to signals received through regular input ports EUI[0:4] and EBI[0:4]. Also, each of LUBs 308, 312, 316 and 320 receives signals through input ports GI[0:5] and JI[0:7]. The input signals via input port JI[0:7] include two output signals JO and JPO from each of LUBs 308, 312, 316 and 320. Thus, two output signals JO and JBO of each of LUBs 308, 312, 316 and 320 are fed back to the inputs by way of JI[0:7].

Input signals GI[0:5], are selected from the SL[0:7] and GG[0:7] routing resources. Sixteen-to-one multiplexer 324 selects one of the inputs from routing resources SL[0:7] and GG[0:7] and makes four copies of the selected input, as indicated by the slash "/" and associated number "4". Thus the routing resource GI[0:3] is shown exiting multiplexer 324. Routing resource GG[7] and CI are added to the GI[10:3] bus, thereby forming a GI[0:5] bus.

Each of LUBs 308, 312, 316 and 320 also includes a clock/enable1preset/clear ("C/E/P/C") input. The C/E/P/C input is used to control a flip-flop included inside each of LUBs 308, 312, 316 and 320. The C/E/P/C input signal is generated by selection circuitry, shown in the dashed lines of box 326. The C/E/P/C selection circuitry receives inputs UI[0:4], BI[0:4], JI[0:7], and GI[0:5] at each of twenty-four-to-one multiplexers 328, 332, 336 and 340. Each multiplexer 328, 332, 336 and 340 selects one signal from buses UI[0:4], BI[0:4], JI[0:7], and GI[0:5]. Each signal selected by each multiplexer 328, 332, 336 and 340 is sent to nine-to-one multiplexers 344, 348, 352, and 356 via routing resources GX[O], GX[1], GX[2], and GX[3] respectively. Each of nine-to-one multiplexers 344, 348, 352, and 356 also receives an input from the GG[0:7] routing resource. The signal selected by multiplexer 344 becomes clock signal CLK, the signal selected by multiplexer 348 becomes preset signal PRSTN ("P"), the signal selected by multiplexer 352 becomes clear signal CLRN("C"), and the signal selected by multiplexer 356 becomes enable signal E. The use of multiplexers 344, 348, 352 and 356 allows any of the signals GX[0:3], GG[0:7], and ground to be selected as one of the C/E/P/C signals.

The GG[0:7] bus is an inter-tile global bus that is coupled to every FG in all FPGA tiles. The signals in the GG[0:7] bus are often selected as the C/E/P/C signals. It should be well understood, however, that the illustrated C/E/P/C selection circuitry from FIG. 4 is just one embodiment of such a selection circuit s and that various different designs of C/E/P/C selection circuit in box 326 may be used to select various different signals in accordance with the invention.

It should be understood, however, that various different designs of the circuitry discussed above may be used to select various different numbers of signals for LUBs 308, 312, 316 and 320 in accordance with the invention. In one embodiment, LUBs 308, 312, 3.16 and 320 are all of the same design, but in another embodiment they are not of the same design.

Figure 5:
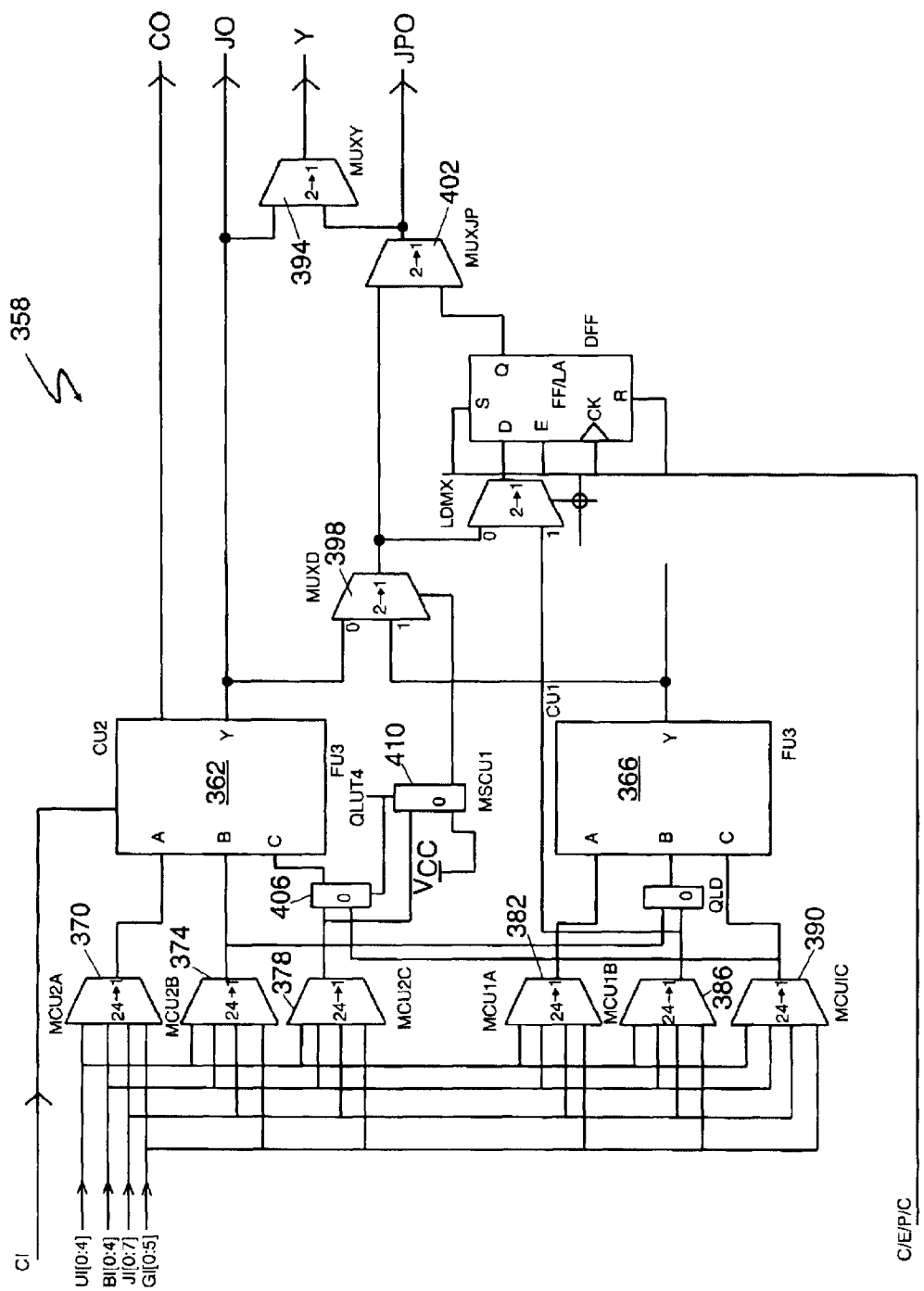
FIG. 5 is a schematic illustrating a more detailed view of a look up table which comprises a functional group.

FIG. 5 illustrates a more detailed view of one of LUBs 308, 312, 316, and 320 from FIG. 4. LUB 358 includes two look-up tables ("LUTs") 362 and 366. Each LUT 362 and 366 comprises three inputs A, B, C, one output Y, and several internal memory cells (not shown). LUT 362 also comprises output CO. LUTs 362 and 366 are configured by programming internal memory cells (not shown), and the setting of the internal memory cells taken together provides a specific configuration for each of LUTs 362 and 366. Configuration data used to program the internal memory cells is generated by design software. Once a specific configuration of the internal memory cells is decided upon, inputs A, B, C may be used to generate output Y in accordance with the desired logic function.

Inputs A, B, C of the LUT 362 are provided by twenty-four-to-one multiplexers 370, 374 and 378, respectively, and inputs A, B, C of LUT 366 are provided by twenty-four-to-one multiplexers 382, 386 and 390, respectively. Each of multiplexers 370, 374, 378, 382, 386, 390 receives as inputs buses EUI[0:4], EBI[0:4], JI[0:7], and GI[0:5], comprising twenty four inputs in total. Three signals are selected from these twenty-four signals as inputs A, B, C for each of LUTs 362 and 366.

When only a three input LUT is needed, one of LUTs 362 and 364 is used. In one embodiment, LUT 362 is used while LUT 364 is not used. The Y output of LUT 362 can be sent directly to the JO output of LUB 358, or the Y output of LUT 362 can be sent to the Y output of LUB 358 by using two-to-one multiplexer 394 to select the Y output of LUT 362. Additionally, the Y output of LUT 362 can be sent to the JPO output of the LUB 358 by using two-to-one multiplexer 398 to select the Y output of the LUT 362 and two-to-one multiplexer 402 to select the output of multiplexer 398. Thus, multiplexers 394, 398 and 402 can be used to send the Y output of LUT 362 to any of the outputs Y, JO, JPO of the LUB 358.

Additionally, when two, three input LUTs are needed, LUT 362 and 366 can be used independently as three input LUTs. The Y output of LUT 362 can be sent directly to the JO output of LUB 358, or the Y output of the LUT 362 can be sent to the Y output of the LUB 358 by using two-to-one multiplexer 394 to select the Y output of LUT 362. The Y output of LUT 366 can be sent directly to the JPO output of LUB 358, or the Y output of the LUT 366 can be sent to the Y output of the LUB 358 by using two-to-one multiplexer 394 to select the output of two-to-one multiplexer 402, which can select the output of two-to-one multiplexer 398, which can select the Y output of the LUT 366.

As stated previously, one purpose of including two LUTs in the LUB is so that they can be used together to provide a four-input LUT. Specifically, the Y output of LUT 362 and the Y output of LUT 366 are connected to the inputs of two-to-one multiplexer 398. In order to simulate a single, four-input LUT, two-to-one multiplexer 406 selects the signal from twenty-four-to-one multiplexer 390 as input C to LUT 362. Two-to-one multiplexer 410 selects the signal from twenty-four-to-one multiplexer 378 as the fourth input to LUT 362. Thus, both LUTs 362 and 366 receive the first, second and third inputs at their A, B, and C inputs and multiplexer 410 is programmed to select the fourth input and provide it to the control input of multiplexer 398.

According to well-known Boolean logic techniques and the Shannon Expansion, connecting three-input LUTs 362 and 366 in this manner will simulate a single four-input LUT with the result being generated at the output of multiplexer 398. The output of multiplexer 398 can be provided to the JPO output of LUB 358 by way of multiplexer 402 or to the Y output of LUB 358 by way of the multiplexers 394 and 402.

Figure 6:
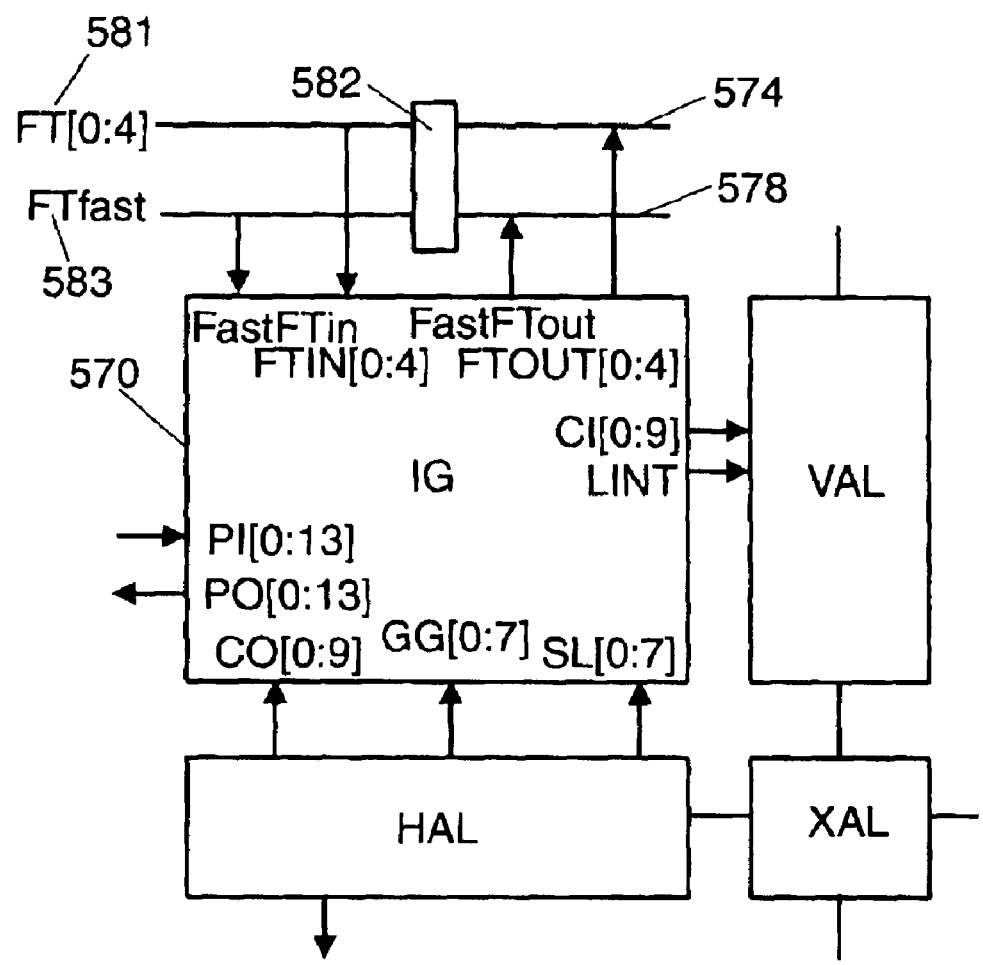
FIG. 6 is a schematic illustrating a freeway routing system on a two by two array of field programmable gate array tiles.

FIG. 6 is a schematic illustrating a more detailed view of the routing resources, including the freeway and fast-freeway routing resources adjacent to interface group 570. Interface group 570 is a representative of any of the interface groups in FIGS. 2 that are not one of a pair of interface groups comprising an IG×2, which are described below with respect to FIG. 7. Interface group 570 has the following inputs: PI[0:13], CO[0:9], GG[0:7], SL[0:7] and the following outputs: PO[0:13], LINT, and CI[0:9].

In addition, freeway routing resource FT[0:4] 581 is coupled to interface group 570 via input FTIN[0:4] and the output FTOUT[0:4] couples resource 581 to resource 574. Fast-freeway routing resource Ftfast 583 is also coupled to interface group 570 via input fastFTin and the output fast-FTout couples resource 583 to resource 578. Segmentation buffer 582 isolates resource 581 from resource 574, and resource 583 from resource 578. Segmentation buffer 582 allows the user to isolate the freeway routing resource input side from the output side. Likewise the break buffer allows the user to isolate the fast-freeway routing resource input side from the output side.

Figure 7:
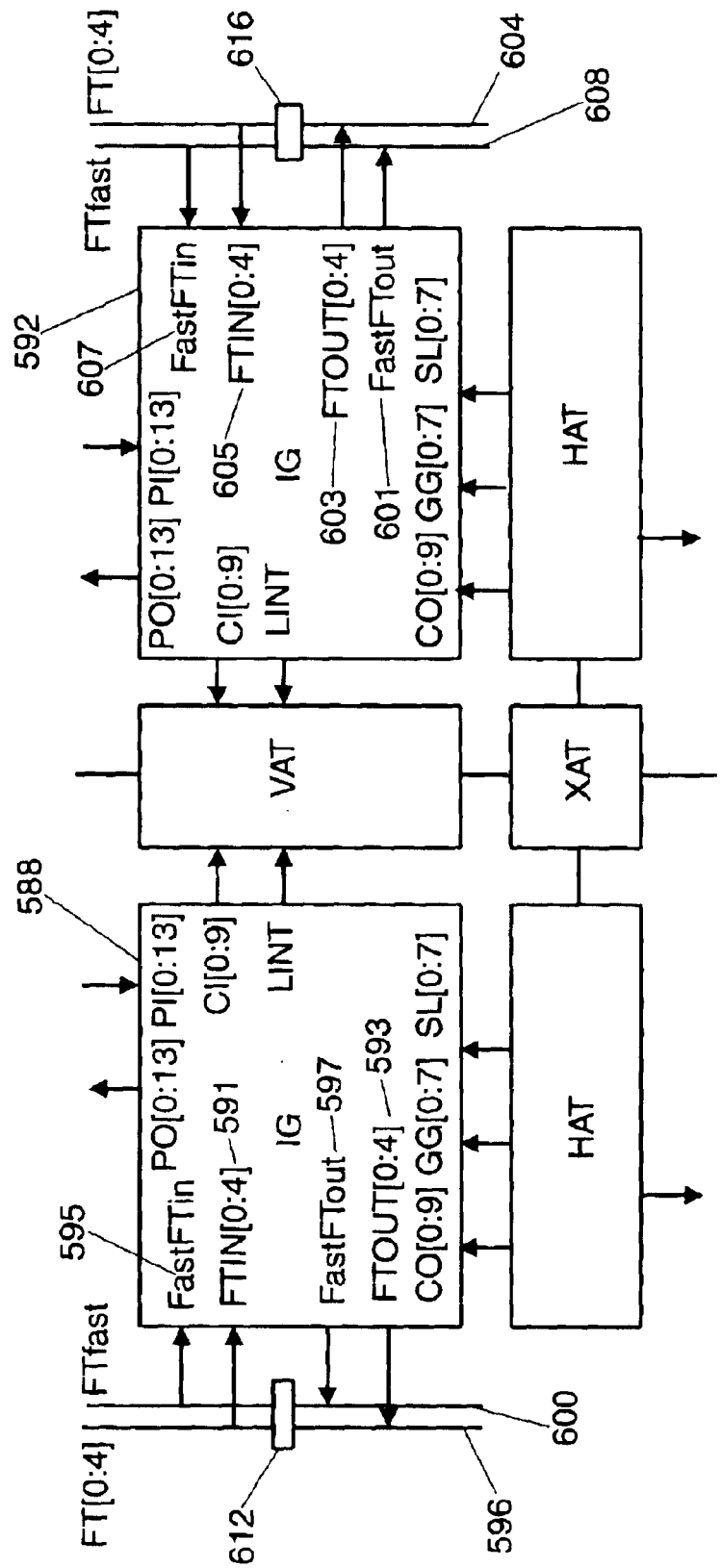
FIG. 7 is a schematic illustrating a fast-freeway routing system on a two by two array of field programmable gate array tiles.

FIG. 7 is a schematic illustrating a more detailed view of a typical side-by-side grouping of interface groups first shown in FIG. 2 and collectively referred to as an "IG×2". Interface groups 588 and 592 each has the following outputs: PO[0; 13], CI[0:9], and LINT. Each interface group 588 and 592 has the following inputs: PI[0:13], CO[0:9], GG[0:7], and SL[0:7].

Interface groups 588 and 592 are each coupled to freeway routing resources 596 and 604 and a fast-freeway routing resource 600 and 608, respectively. Interface group 588 is coupled to freeway routing resource 596 by input FTIN[0:4] 591 and output FTOUT[0:4] 593. Interface group 588 is coupled to fast-freeway routing resource 600 by input fast-FTin 595 and output fastFTout 597.

Interface group 592 is coupled to freeway routing resource 604 via input FTIN[0:4] 605 and output FTOUT [0:4] 603. Interface group 592 is coupled to fast-freeway routing resource 608 by input fastFTin 607 and output fastFTout 601. Located on fast-freeway and freeway routing resources 608 and 604 between the inputs and outputs and on fast-freeway and freeway routing resources 600 and 596 between the inputs and outputs are bi-directional 3-state segmentation buffers 612 and 616. Segmentation buffers 612 and 616 allow the user to isolate the freeway routing resources input side from the output side. Likewise the segmentation buffers allow the user to isolate the fast-freeway routing resource input side from the output side.

Figure 8:
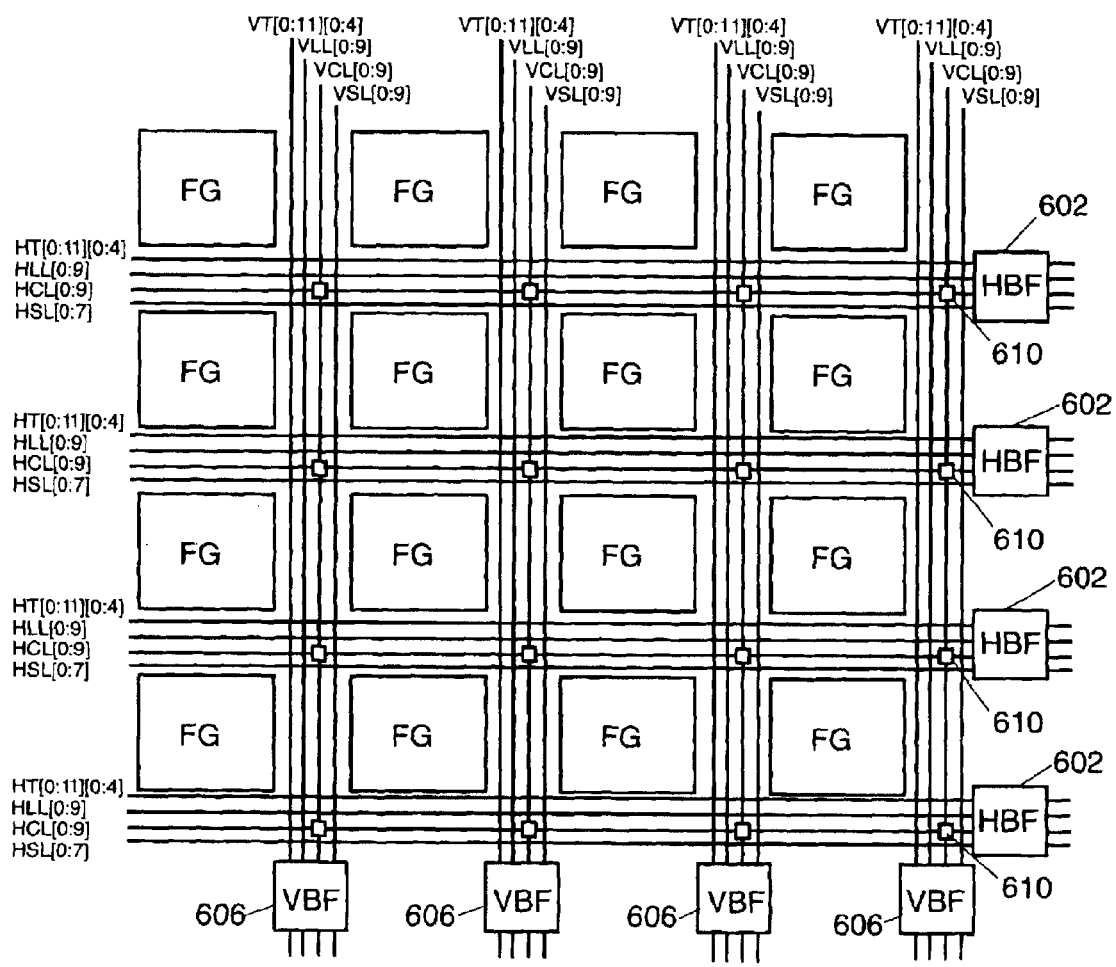
FIG. 8 is a schematic illustrating horizontal intra-tile buffers and vertical intra-tile buffers on a portion of one field programmable gate array tile.

FIG. 8 illustrates a portion of the plurality of functional groups comprising a FPGA tile (see FIG. 2). Intra-tile horizontal buffers ("HBF") 602 are horizontally spaced apart by four functional groups. Intra-tile vertical buffers ("VBF") 606 are vertically spaced apart by four functional groups. Other spacing for the tile buffers may be used depending on design requirements. Horizontal routing resources HT[0:11] [0:4], HLL[0:9], HCL[0:9], and HSL[0:7] are buffered at HBF 602. Vertical routing resources VT[0:11][0:4], VLL [0:9], VCL[0:9], and VSL [0:7] are buffered at VBF 606. Details of HBF 602 and VBF 606 are illustrated below.

A primary routing structure comprises the horizontal routing resources and the vertical routing resources. The routing resources VCL[0:9] and HCL[0:9] intersect at programmable interconnect 610.

Figure 9B:
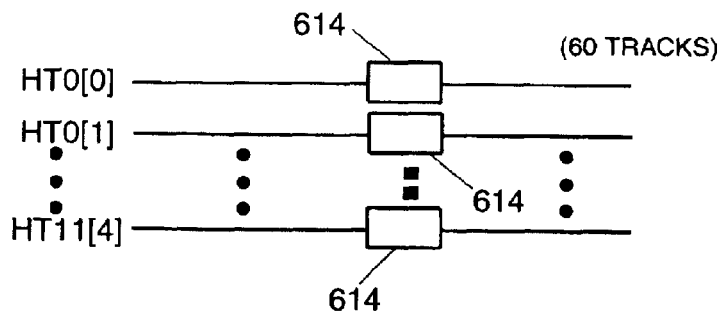
FIGS. 9a and 9b are schematics illustrating intra-tile horizontal buffers.
Figure 9B:
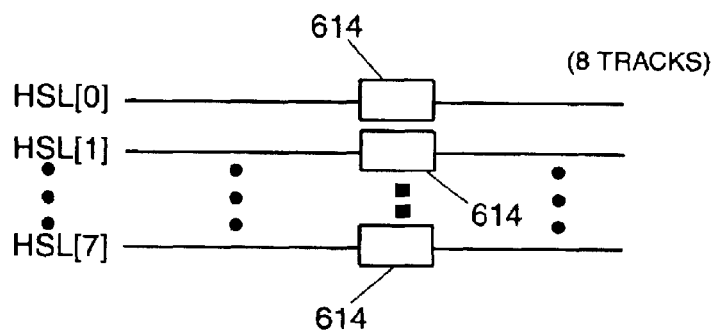
Figure 9B:
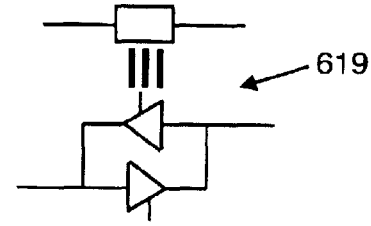
Figure 9A:
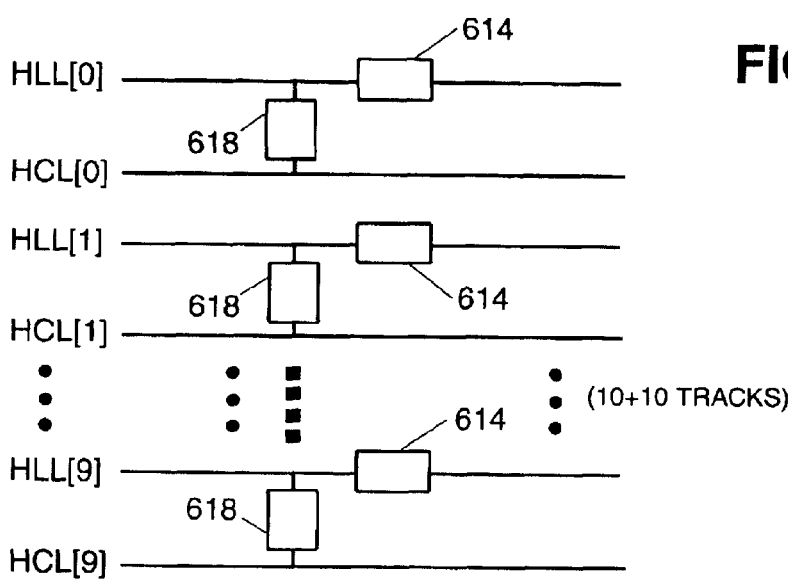

FIG. 9a is a schematic illustrating a more detailed view of HBF 602 from FIG. 8. Each of the HT[0:11][0:4], HSL[0:7] and HLL[0:9] tracks are segmented by buffer 614, or an intra-bus buffer. However, the HCL[0:9] tracks do not have a buffer that segments them. Buffer 618, or a cross-bus buffer, couples together each of the HCL[0:9] with each of the HLL[0:9] tracks. HCL[0:9] tracks are considered "long-distance" tracks because they are not segmented, while HLL[0:9] tracks are considered "local" because they are segmented. HLL[0] is segmented by buffer 614 and coupled through buffer 618 to HCL[0], which is not segmented. HLL[ 1] is segmented by buffer 614 and coupled through buffer 618 to HCL[1], which is not segmented, and so on, until HLL[9] is segmented by buffer 614 and coupled through buffer 618 to HCL[9], which is not segmented.

Because the HCL tracks are coupled in this way to a buffer, the HCL tracks may be referred to as a non-segmented, horizontal bus. The HLL may be referred to as the segmented, horizontal bus due to the buffer. Vertical buffers 618 also comprise the three-state bi-directional transistor configuration shown in FIG. 9b.

FIG. 9b is a schematic illustrating three-state, bi-directional transistor configuration 619. Configuration 619 represents buffers 614 and 618 from FIG. 9a. Configuration 619 may isolate signals on one side of the configuration from signals on the other side, allowing a single line to behave as if it were two separate lines. Configuration 619 may also allow signals to pass in one direction while blocking signals from the other direction.

FIG. 10a is a schematic illustrating a more detailed view of VBF 606 in FIG. 8. Each of the VT[0:11][0:4], VSL[0:7] and VLL[0;9] tracks are segmented by bi-directional buffer 622, or an intra-bus buffer. However, the VCL[0:9] tracks do not have a buffer that segments them. Buffer 626, or a cross-bus buffer, couples together each VCL[0:9] with each VLL[0:9] tracks. VCL[0:9] tracks are considered "long-distance" tracks because they are not segmented, while VLL[0:9] tracks are considered "local" because they are segmented. VLL[0] is segmented by buffer 622 and coupled through buffer 626 to VCL[0], which is not segmented. VLL[ 1] is segmented by buffer 622 and coupled through buffer 626 to VCL[1], which is not segmented, and so on, until VLL[9] is segmented by buffer 622 and coupled through buffer 626 to VCL[9], which is not segmented.

Because the VCL tracks are coupled in this way to a buffer, the VCL tracks may be referred to as a non-segmented, vertical bus. The VLL tracks may be referred to as the segmented, vertical bus due to the buffer. Each of buffers 626 also comprise a three-state bi-directional transistor configuration illustrated in 25 FIG. 10b.

FIG. 10b is a schematic illustrating three-state, bi-directional transistor configuration 639. Configuration 639 represents buffers 622 and 626 from FIG. 10a. Configuration 639 may isolate signals on one side of the configuration from signals on the other side, allowing a single line to behave as if it were two separate lines. Configuration 639 may also allow signals to pass in one direction while blocking signals from the other direction.

Figure 11A:
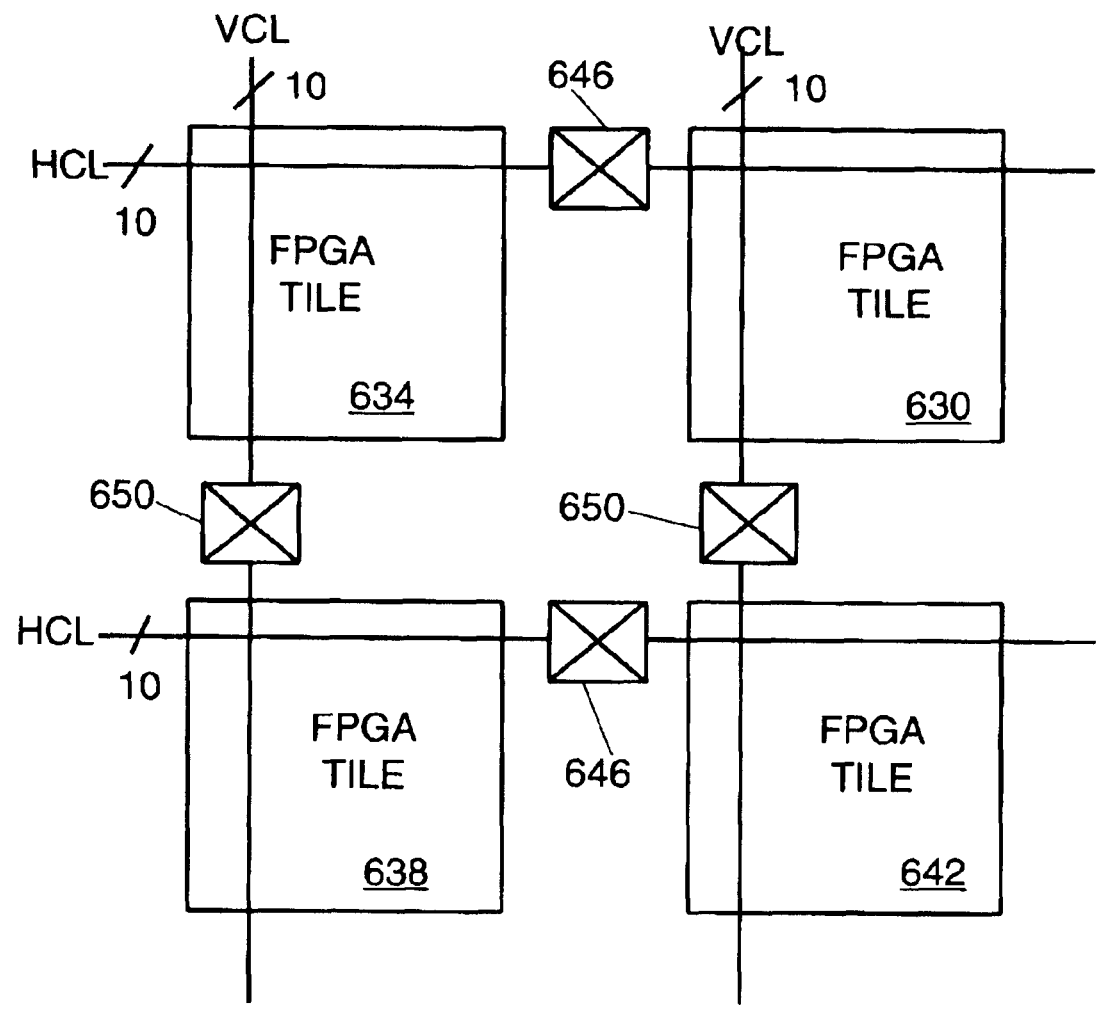
FIGS. 11a and 11b are schematics illustrating inter-tile buffers.

FIG. 11a is a schematic illustrating a buffering system for each of the VCL[0:9] and HCL[0:9] tracks. Four FPGA tiles 630, 634, 638, and 642 are coupled together (see FIG. 1 for another example of four FPGA tiles coupled together). There are 17 HCL[0:9] routing resources evenly distributed across tiles 634 and 630. However, only one HCL[0:9] traversing across 630 and 634 is shown for simplicity. Likewise, there are 17 HCL[O:9] routing resources evenly distributed across tiles 638 and 642. However, only one HCL[:9] routing resource traversing tiles 638 and 642 is shown for simplicity. Thus, there are a total of 34 HCL[0:9] routing resources traversing the two columns of tiles. Located between each column of tiles on each of the HCL[0:9] resources is buffer 646.

There are 10 VCL[0:9] routing resources evenly distributed across tiles 634 and 638. However, only one VCL[0.9] traversing across 634 and 638 is shown for simplicity. Likewise, there are 10 VCL[0:9] routing resources evenly distributed across tiles 630 and 642. However, only one VCL[0:9] routing resource traversing tiles 630 and 642 is shown for simplicity. Thus, there are a total of 20 VCL[0:9] routing resources traversing the two rows of tiles. Located between each row of tiles on each of the VCL[0:9] resources is buffer 650. Buffer 650 comprises the multiplexer and buffer configuration illustrated in FIG. 11b and described below.

Figure 11B:
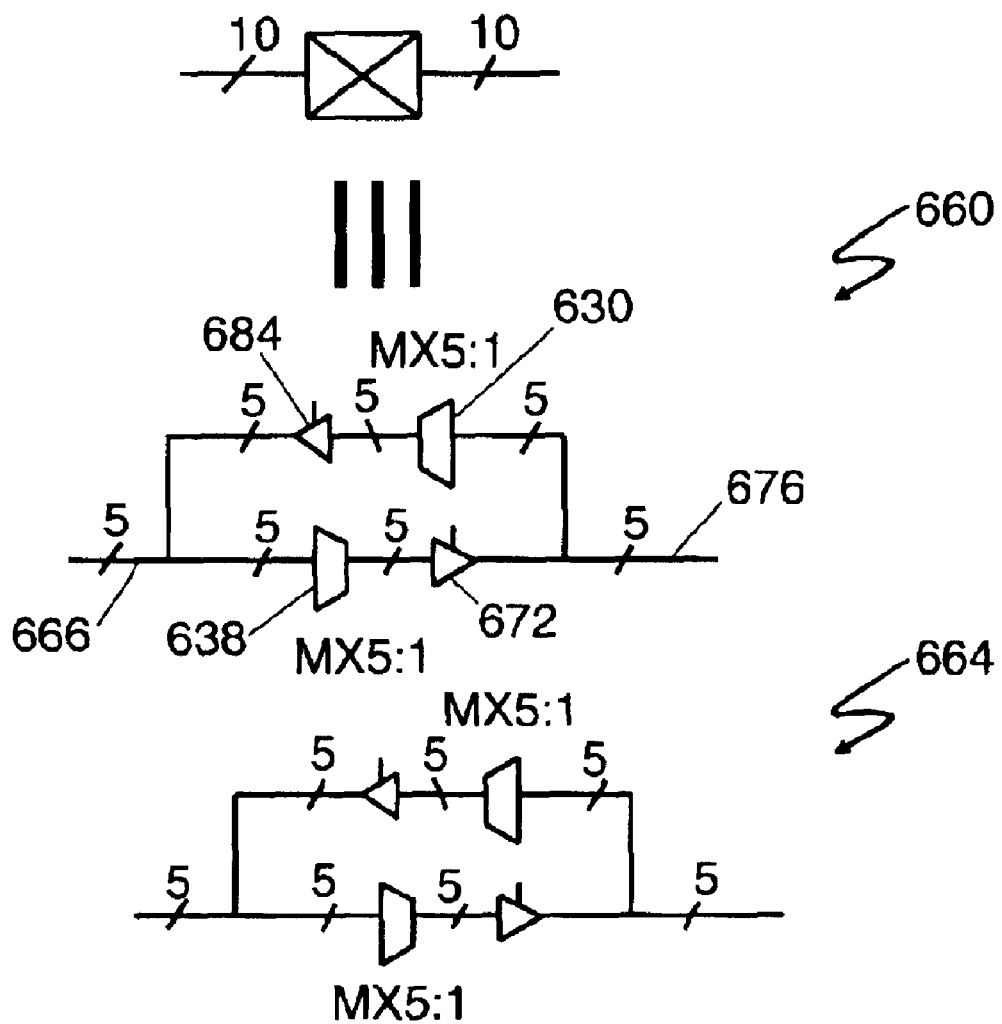

FIG. 11b is a schematic illustrating buffer areas 646 and 650 in greater detail. Buffers 646 and 650 comprise sets 660 and 664 of bi-directional three-state buffers and multiplexers. Sets 660 and 664 are identical and the description for set 660 applies to set 664. Five-line routing resource input 666 transmits input signals from the left and couples to 5 to 1 multiplexer 638, which is coupled to three-state buffer 672, and finally couples to five-line routing resource output 676 on the right. If the right side is configured to be an input and the left side to be an output, then the input may come in from 5 line routing resource input 676, which couples to 5 to 1 multiplexer 630, which couples to three-state buffer 684, which couples to five-line routing resource output 666 to the left. Set 664 is configured the same as set 660.

One set of buffers may be configured to allow input from one side while the other may be configured to allow input from the other side. Alternatively, both sets may be configured to allow input from the same side.

The routing interconnect areas includes transistor switches and memory cells at many intersections of signal lines, but not at all intersections. From this disclosure, it will be apparent to persons of ordinary skill in the art, however, that the specific number of lines in any of the routing buses may vary in accordance with the present disclosed system. Furthermore, it should be well understood that the specific number of lines in any of the signal buses may vary in accordance with the present disclosed system.

From this disclosure, it will be apparent to persons of ordinary skill in the art that various alternatives to the embodiments of the disclosed system described herein may be employed in practicing the disclosed system. It is intended that the following claims define the scope of the disclosed system and that structures and methods within the scope of these claims and their equivalents be covered thereby.

What is claimed is:

1. A field programmable gate array, said field programmable gate array comprising:
    a plurality of field programmable gate array tiles arranged in an array of rows and columns, each field programmable gate array tile comprising:
        a plurality of functional groups wherein each of said plurality of functional groups is configured to receive at least one input signal, and generate at least one output signal,
        a plurality of interface groups, wherein each of said plurality of interface groups is configured to selectively transfer signals between said primary routing structure and circuitry external to the field programmable gate array tile, and
        a primary routing structure including a horizontal bus and a vertical bus wherein the primary routing structure is coupled to said functional groups and interface groups, and is configured to receive signals from said plurality of functional groups and said plurality of interface groups and provide signals between said plurality of functional groups and said plurality of interface groups;
    a horizontal buffer connecting a primary routing structure in a first one of said plurality of field programmable gate array tiles in a first column and to a primary routing structure in a second one of said plurality of programmable gate array tiles in a second column adjacent to said first column; and
    a vertical buffer connecting a primary routing structure in a first one of said plurality of field programmable gate array tiles in a first row to a primary routing structure in a second one of said plurality of programmable gate array tiles in a second row adjacent to said first row.

2. The field programmable gate array of claim 1, said horizontal buffer comprising at least two, three-state buffers arranged in a bi-directional configuration, between said first one of said plurality of field programmable gate array tiles and said second one of said plurality of field programmable gate array tiles.

3. The field programmable gate array of claim 2, wherein said horizontal buffer is coupled to said horizontal bus in the primary routing structure in a first one of said plurality of field programmable gate array tiles in the first column and to said horizontal bus of the primary routing structure in the second one of said plurality of programmable gate array tiles in the second column.

4. The field programmable gate array of claim 1, wherein said horizontal buffer further comprises at least two, five-to-one multiplexers arranged in a bi-directional configuration between said first one of said plurality of field programmable gate array tiles and said second one of said plurality of field programmable gate array tiles.

5. The field programmable gate array of claim 3, wherein said horizontal bus of said primary routing structure of each of said plurality of filed programmable gate array tiles further comprises:
    a horizontal, segmented bus; and
    a horizontal, non-segmented bus, coupled to said horizontal buffer.

6. The field programmable gate array of claim 5, wherein said horizontal, non-segmented bus is configured to transfer signals between said plurality of field programmable gate array tiles.

7. The field programmable gate array of claim 5, wherein said horizontal bus of said primary routing structure of each of said plurality of filed programmable gate array tiles further comprises:
    a cross-bus buffer coupling said horizontal, non-segmented bus to said horizontal, segmented bus.

8. The field programmable gate array of claim 6, wherein said horizontal bus of said primary routing structure of each of said plurality of filed programmable gate array tiles further comprises:
    an inter-bus buffer coupled to said horizontal, segmented bus.

9. The field programmable gate array of claim 8, wherein said cross-bus buffer comprises a bidirectional, three-state transistor configuration and said inter-bus buffer comprises a bidirectional, three-state transistor configuration.

10. The field programmable gate array of claim 1, said vertical buffer comprising at least two, three-state buffers arranged in a bi-directional configuration, between said first one of said plurality of field programmable gate array tiles in said first row and said second one of said plurality of field programmable gate array tiles in said second row.

11. The field programmable gate array of claim 10, wherein said vertical buffer is coupled to said vertical bus in the primary routing structure in a first one of said plurality of field programmable gate array tiles in the first row and to said horizontal bus of the primary routing structure in the second one of said plurality of programmable gate array tiles in the second row.

12. The field programmable gate array of claim 11, wherein each said vertical buffer further comprises at least two, five-to-one multiplexers arranged in a bi-directional configuration between said first one of said plurality of field programmable gate array tiles in said first row and said second one of said plurality of field programmable gate array tiles in said second row.

13. The field programmable gate array of claim 11, wherein said vertical bus of said primary routing structure of each of said plurality of filed programmable gate array tiles further comprises:

a vertical, segmented bus; and a vertical, non-segmented bus, said vertical, non-segmented bus coupled to said vertical buffer.

14. The field programmable gate array of claim 13, wherein said vertical, non-segmented bus is configured to transfer signals between said plurality of field programmable gate array tiles.

15. The field programmable gate array of claim 14, said vertical bus of f said primary routing structure of each of said plurality of filed programmable gate array tiles further comprises:

a cross-bus buffer coupling said vertical, non-segmented bus to said vertical, segmented bus.

16. The field programmable gate array of claim 15, said vertical bus of f said primary routing structure of each of said plurality of filed programmable gate array tiles further comprises:

an inter-bus buffer coupled to said vertical, segmented bus.

17. The field programmable gate array of claim 16, wherein said cross-bus buffer comprises a bidirectional, three-state transistor configuration and said inter-bus buffer comprises a bidirectional, three-state transistor configuration.

* * * * *